United States Patent
Takiar et al.

(10) Patent No.: US 7,259,028 B2
(45) Date of Patent: Aug. 21, 2007

(54) TEST PADS ON FLASH MEMORY CARDS

(75) Inventors: Hem Takiar, Fremont, CA (US); Shrikar Bhagath, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/321,663

(22) Filed: Dec. 29, 2005

(65) Prior Publication Data

US 2007/0152215 A1    Jul. 5, 2007

(51) Int. Cl.
*H01L 21/66* (2006.01)

(52) U.S. Cl. .......................... 438/15; 438/18; 438/123
(58) Field of Classification Search .................. 438/15, 438/18, 123
See application file for complete search history.

(56) References Cited

U.S. PATENT DOCUMENTS

| | | | |
|---|---|---|---|
| 5,250,841 A * | 10/1993 | Sloan et al. .................. 257/666 |
| 5,334,857 A * | 8/1994 | Mennitt et al. ................ 257/48 |
| 6,680,213 B2 * | 1/2004 | Farnworth et al. ............ 438/15 |
| 7,057,405 B2 * | 6/2006 | Pu .............................. 324/754 |
| 2002/0013071 A1 * | 1/2002 | Ong ............................ 439/71 |

* cited by examiner

*Primary Examiner*—Trung Dang
(74) *Attorney, Agent, or Firm*—Vierra Magen Marcus & DeNiro LLP

(57) ABSTRACT

A semiconductor package is disclosed including test pads formed of solder bumps affixed to the semiconductor package during fabrication. When the package is encapsulated, due to the pressure exerted on the package during the encapsulation process, portions of the solder bumps get flattened out to be generally flush with and exposed on a surface of the semiconductor package. These exposed portions of the solder bumps form the test pads by which the finished package may be tested.

17 Claims, 4 Drawing Sheets

TEST PADS ON FLASH MEMORY CARDS

BACKGROUND OF THE INVENTION

1. Field of the Invention

Embodiments of the present invention relate to a flash memory card including an integrated circuit package having test pads.

2. Description of the Related Art

As the sizes of electronic devices continue to decrease, the associated semiconductor packages that operate them are being designed with smaller form factors, lower power requirements and higher functionality. Currently, sub-micron features in semiconductor fabrication are placing higher demands on package technology including higher lead counts, reduced lead pitch, minimum footprint area and significant overall volume reduction.

One branch of semiconductor packaging involves the use of a leadframe, which is a thin layer of metal on which one or more semiconductor die are mounted and supported. The leadframe includes electrical leads for communicating electrical signals from the one or more semiconductors to a printed circuit board or other external electrical devices. FIG. 1 shows a leadframe 20 before attachment of a semiconductor die 22. A typical leadframe 20 may include a number of leads 24 having first ends 24a for attaching to semiconductor die 22, and a second end (not shown) for affixing to a printed circuit board or other electrical component. Leadframe 20 may further include a die attach pad 26 for structurally supporting semiconductor die 22 on leadframe 20. While die attach pad 26 may provide a path to ground, it conventionally does not carry signals to or from the semiconductor die 22. In certain leadframe configurations, it is known to omit die attach pad 26 and instead attach the semiconductor die directly to the leadframe leads in a so-called chip on lead (COL) configuration.

Semiconductor leads 24 may be mounted to die attach pad 26 as shown in FIG. 2 using a die attach compound. Semiconductor die 22 is conventionally formed with a plurality of die bond pads 28 on at least first and second opposed edges on the top side of the semiconductor die. Once the semiconductor die is mounted to the leadframe, a wire bond process is performed whereby bond pads 28 are electrically coupled to respective electrical leads 24 using a delicate wire 30. The assignment of a bond pad 28 to a particular electrical lead 24 is defined by industry standard specification. FIG. 2 shows less than all of the bond pads 28 being wired to leads 24 for clarity, but each bond pad may be wired to its respective electrical lead in conventional designs. It is also known to have less than all of the bond pads wired to an electrical lead as shown in FIG. 2.

Typically, leadframe 20 is initially formed from a panel including a plurality of such leadframes. The semiconductor die 22 are mounted and electrically connected to each leadframe in the panel, and the integrated circuits formed thereby are encapsulated in a molding compound. Thereafter, the individual encapsulated integrated circuits are cut from the panel, or singulated, into a plurality of semiconductor packages.

It is known to form test pads within the semiconductor package. The test pads typically are exposed to the outside of the package and are electrically connected internally to one or more of the semiconductor die in the package. After fabrication of a semiconductor package, the package may be inserted into a socket on a test card, whereupon the test pads are contacted by probes to test the electrical properties and functioning of the semiconductor package to determine whether the finished semiconductor package performs per specification.

Typically, a pattern for the test pads is formed in a leadframe or other substrate such as a printed circuit board during the substrate fabrication step. The pattern may for example be formed in a chemical etching or mechanical stamping process. After formation, the test pads are left exposed during the molding encapsulation step in forming the package to allow access to the test pads after package formation. Once the package is fabricated and tested via the test pads, the package may be encased in a pair of mating lids which cover the test pads, and prevent their access while the semiconductor package is in use.

SUMMARY OF INVENTION

The present invention, roughly described, relates to a semiconductor package including test pads formed of solder bumps affixed to the semiconductor package during fabrication. The semiconductor packages may be formed on leadframes. A plurality of leadframes may be batch processed on a panel in a known fabrication process, such as for example, chemical etching or in a mechanical stamping process using progressive dies.

During the package fabrication process, one or more semiconductor die are mounted and electrically connected to the leadframes to form integrated circuits. Thereafter, the integrated circuits are encapsulated in molding compound. After encapsulation, the integrated circuits may be singulated by cutting the integrated circuits from the leadframe panel into a plurality of individual integrated circuit packages.

The semiconductor die may be formed with a plurality of bond pads. After the semiconductor die are mounted to the leadframe, each bond pad may receive a solder bump in a known solder bumping process. Other electrically conductive, deformable materials may be used in place of solder in alternative embodiments. A portion of the leadframe including the contact fingers may lie in a reference plane. The size of the solder bumps is selected so that, once reflowed onto the semiconductor die bond pads, the reference plane 150 runs through the solder bumps and a small portion of the solder bumps extend beyond the reference plane.

The package is encapsulated so that a bottom surface of the package lies generally in the reference plane. Due to the pressure exerted on the package during the encapsulation process, the portions of the solder bumps extending past the reference plane get substantially flattened out to be generally flush with the reference plane and the bottom surface of the semiconductor package. Thus, the partially flattened solder bumps are flush with and exposed to the exterior of the package. These exposed portions of the solder bumps form the test pads by which the finished package may be tested.

DETAILED DESCRIPTION

The embodiments of the present invention will now be described with reference to FIGS. 3 through 10, which generally relate to a semiconductor package including test pads formed of solder bumps affixed to the semiconductor package. It is understood that the present invention may be embodied in many different forms and should not be construed to being limited to the embodiments set forth herein. Rather, these embodiments are provided so that this disclosure will be thorough and complete and will fully convey embodiments of the invention to those skilled in the art. Indeed, the invention is intended to cover alternatives, modifications and equivalents of these embodiments, which are included within the scope and spirit of the invention as defined by the appended claims. Furthermore, in the following detailed description of embodiments of the present invention, numerous specific details are set forth in order to provide a thorough understanding of the present invention. However, it will be clear to those with ordinary skill in the art that the present invention may be practiced without such specific details.

Figure 1:
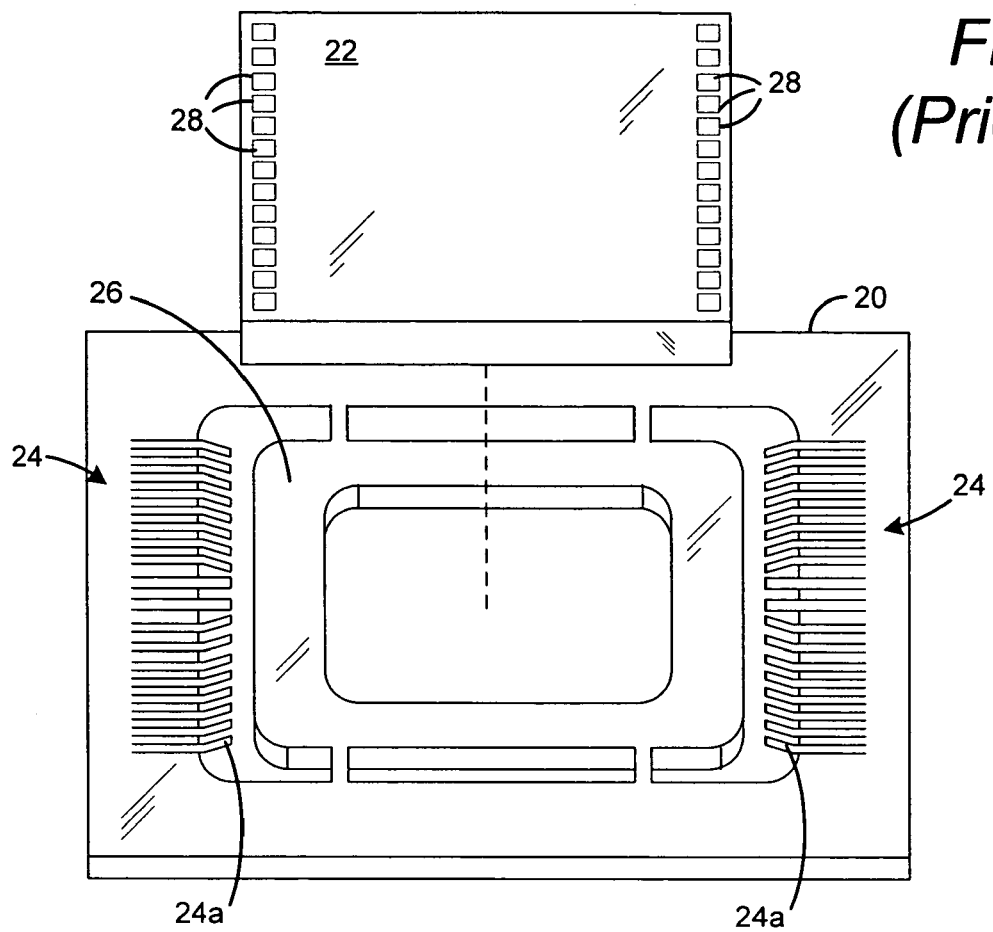
FIG. 1 is an exploded perspective view of a conventional leadframe and semiconductor die.
Figure 2:
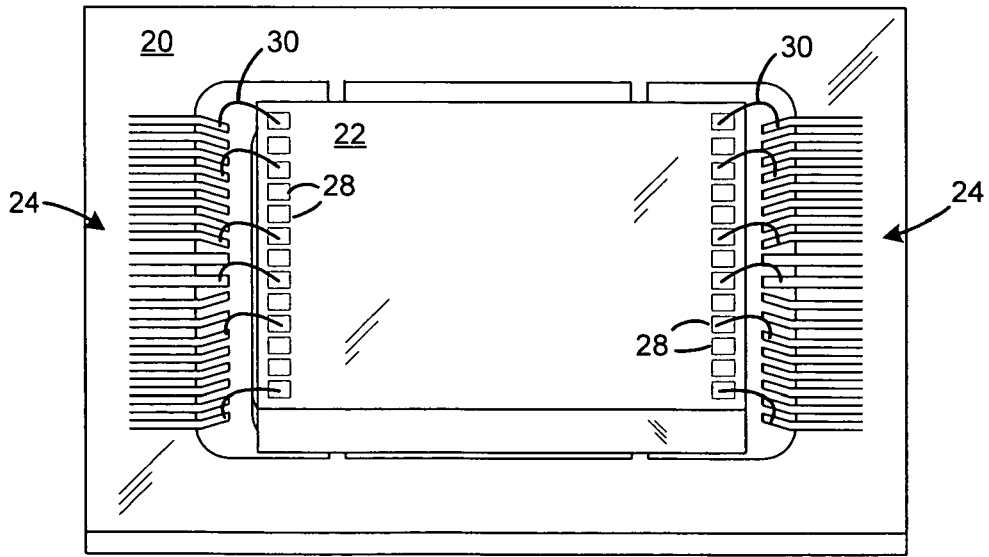
FIG. 2 is a perspective view of a conventional semiconductor die wire bonded to a conventional leadframe.
Figure 3:
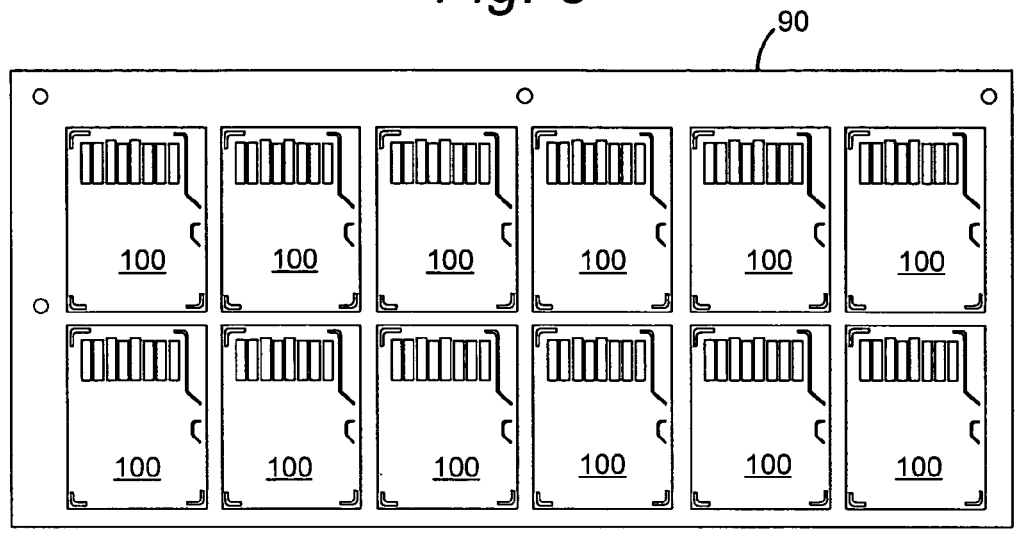
FIG. 3 is a panel including a plurality of leadframes.

In general, leadframes used in the present invention would be batch processed from a panel of leadframes, such as for example panel 90 shown in FIG. 3. In the embodiment shown in FIG. 3, the panel 90 includes a two by six array of leadframes 100. It is understood that panel 90 may be formed in a wide variety of arrays of varying columns and rows in alternative embodiments. As explained hereinafter, integrated circuits are formed on the plurality of leadframes 100 in panel 90, the integrated circuits are encapsulated in a protective molding compound, and then the encapsulated integrated circuits are singulated from the panel to form a plurality of semiconductor packages.

Figure 4:
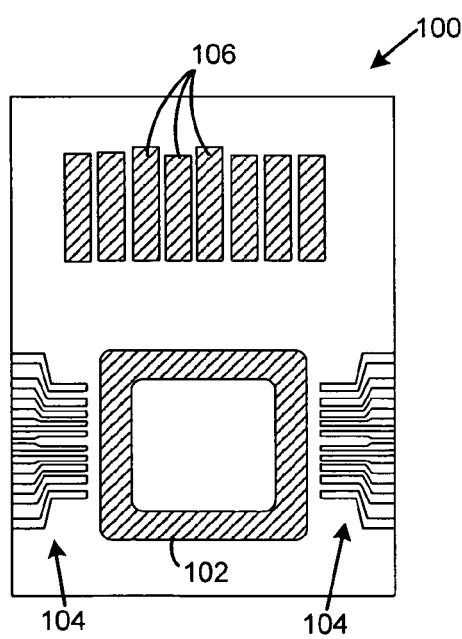
FIG. 4 is a top view of a single leadframe from the panel shown in FIG. 5.

Referring now to FIG. 4, there is shown a single leadframe 100 from panel 90. Leadframe 100 includes a die paddle 102 for supporting one or more semiconductor die. Leadframe 100 further includes electrical leads 104 for communicating electrical signals to and from one or more semiconductor die, and contact fingers 106 for transferring electrical signals between the one or more semiconductor die and an external electronic device.

Leadframe 100 may be formed of a planar or substantially planar piece of metal, such as copper or copper alloys, plated copper or plated copper alloys, Alloy 42 (42Fe/58Ni), or copper plated steel. Leadframe 100 may be formed of other metals and materials known for use in leadframes. In embodiments, leadframe 100 may also be plated with silver, gold, nickel palladium, or copper.

Leadframe 100 may be formed by known fabrication processes, such as for example, chemical etching. In chemical etching, a photoresist film may be applied to the leadframe. A pattern photomask containing the outline of the die paddle 102, electrical leads 104 and contact fingers 106 may then be placed over the photoresist film. The photoresist film may then be exposed and developed to remove the photoresist from areas on the conductive layers that are to be etched. The exposed areas are next etched away using an etchant such as ferric chloride or the like to define the pattern in the leadframe 100. The photoresist may then be removed. Other known chemical etching processes are known.

The leadframe 100 may alternatively be formed in a mechanical stamping process using progressive dies. As is known, mechanical stamping uses sets of dies to mechanically remove metal from a metal strip in successive steps.

While an embodiment of the present invention is implemented using leadframe 100 described above, it is understood that the present invention may be implemented using other mediums, for example, printed circuit boards and other substrates or various polymer tapes.

Figure 5:
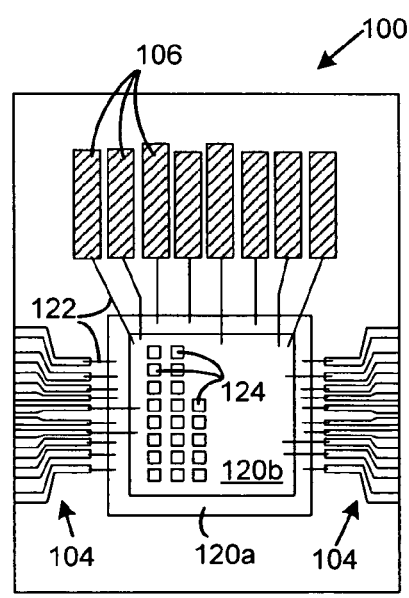
FIG. 5 is a top view of a leadframe including semiconductor die mounted thereon.

Referring now to FIG. 5, after formation of the leadframe, one or more semiconductor die 120 may be mounted to the die paddle 102 of leadframe 100 to form an integrated circuit. In embodiments where leadframe 100 is used in a Transflash flash memory card, the semiconductor die 120 may include flash memory chips (NOR/NAND) 120a and/or a controller chip 120b such as an ASIC. However, it is understood that the leadframe 100 may be used in a variety of semiconductor packages having irregular shaped edges, and a variety of different semiconductor chips and devices may be included within the completed semiconductor package. The one or more semiconductor die 120 may be mounted to leadframe 100 in a known manner using a dielectric die attach compound, film or tape. Once semiconductor die 120 are fixed to leadframe 100, the die can be wire bonded using wire 122 to leadframe leads 104 in a known wire bond process.

In embodiments, for example where die 120b is a controller chip, the chip 120b may include a plurality of bond pads 124 used to test the operation of the completed semiconductor package. The bond pads 124 may be separate from or the same as the bond pads to which wire bonds 122 are affixed to connect the die 120b to the integrated circuit. It is understood that the number of bond pads 124 may vary in alternative embodiments. Bond pads 124 may be redistributed to any desired position on the chip 120b using conductive traces (not shown). Redistribution of the pads 124 allows sufficient spacing between the pads to receive solder bumps as explained hereinafter. It is understood that the bond pads 124 need not be redistributed in alternative embodiments.

Figure 6:
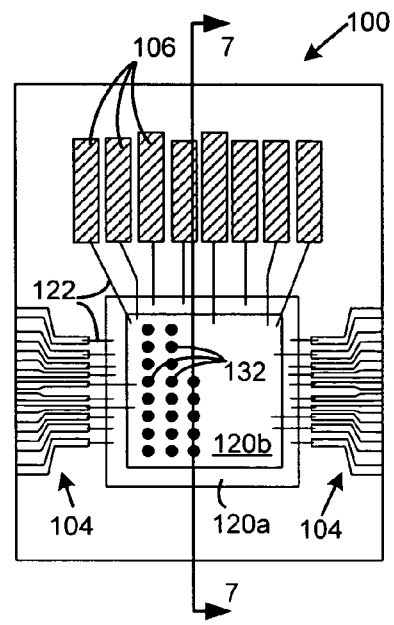
FIG. 6 is a top view of a leadframe including solder bumps for forming test pads according to an embodiment of the present invention.
Figure 7:
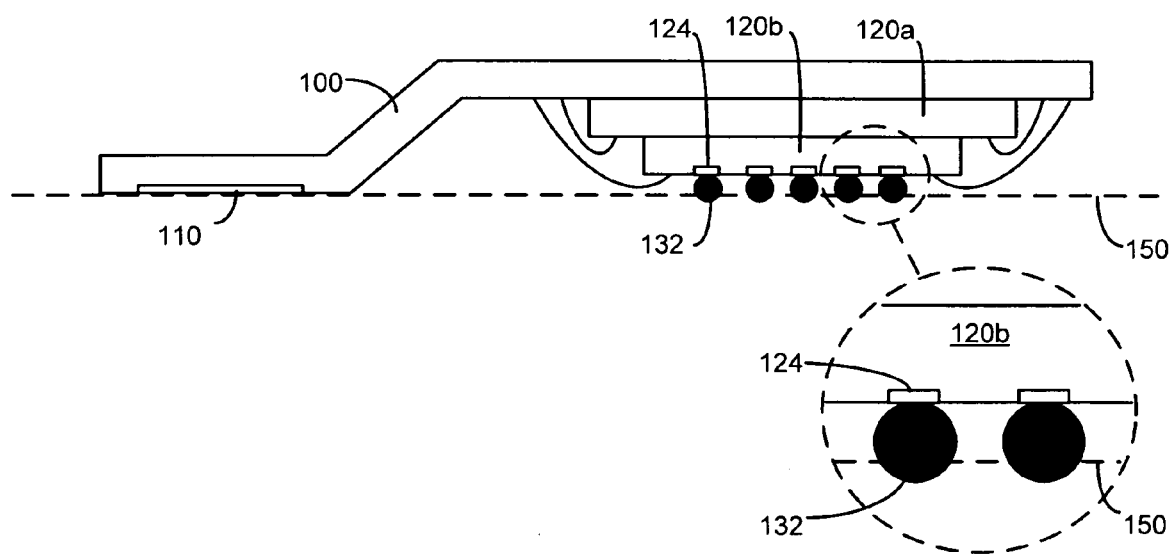
FIG. 7 is a cross-sectional view through a plane along line 7-7 in FIG. 6.

Referring now to FIGS. 6 and 7, once the semiconductor die 120 are mounted on leadframe 100, one or more of the bond pad 124 may receive a mass of solder, such as for example solder bumps 132. Solder bumps 132 may be of known solder material, such as lead/Tin (Pb/Sn) or the like. Other possibilities include nickel/Au bumps, epoxy bumps and gold bumps. It is also possible to use solder bumps with polymer cores. It is understood that other electrically conductive, deformable materials may be used in place of solder in alternative embodiments.

The solder bumps 132 may be attached to bond pads 124 using known solder bumping processes, such as for example those used for attaching solder bumps in flip chips and ball grid arrays (BGAs). In such processes, the bond pads 124 may first be preconditioned in an under bump metallurgy (UBM) step to eliminate non-conductive aluminum oxide as is known in the art. The UBM step provides a low and stable contact resistance at the bump-bond pad interface, but the UBM step may be omitted in alternative embodiments. The solder bumps may then be attached to the bond pads 124 in many processes, including evaporation, electroplating, printing, jetting, stud bumping, and direct placement, each of which is known in the art. In a further embodiment, the solder bumps could be preformed solder balls affixed to bond pads 124 using force and/or heat as is known in the art.

As seen in the cross-sectional view of FIG. 7, the leadframe 100 may be formed in two planes. A first portion of the leadframe 100 including contact fingers 106 may lie in a plane 150. A second portion of the leadframe supporting the one or more semiconductor die 120 may be spaced from the plane 150. The size of the solder bumps is selected so that, once reflowed onto die 120, the plane 150 runs through the solder bumps 132 and a small portion of the solder bumps 132 extend beyond the plane 150. In embodiments, the solder bumps may have a diameter above the semiconductor die 120 of approximately 0.5 mm to 1 mm, and more particularly, 0.7 mm to 0.8 mm. It is understood that the diameter of the solder bumps may vary outside of this range in alternative embodiments. The solder bumps may extend beyond the plane 150 approximately 10 μm to 100 μm, and more particularly, 50 μm to 80 μm. It is understood that the solder bumps may extend beyond the plane 150 to a greater or lesser degree than set forth above in alternative embodiments. In embodiments, each of the solder bumps may have approximately the same size.

Figure 8:
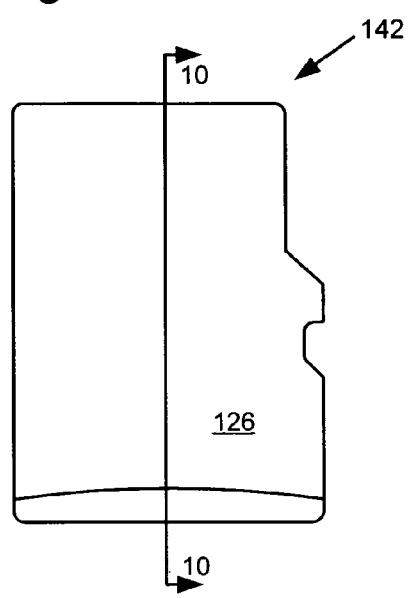
FIG. 8 is a top view of a finished semiconductor package according to an embodiment of the present invention.
Figure 9:
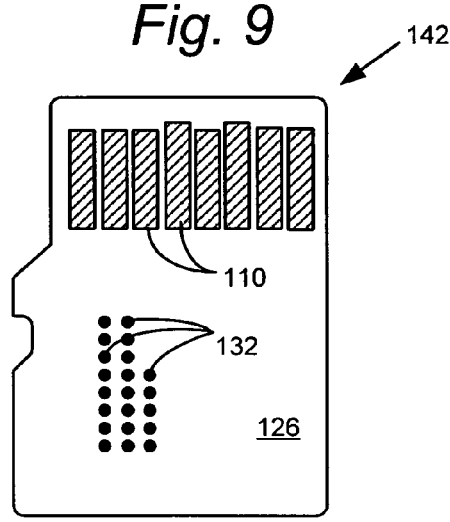
FIG. 9 is a bottom view of a finished semiconductor package according to an embodiment of the present invention.
Figure 10:
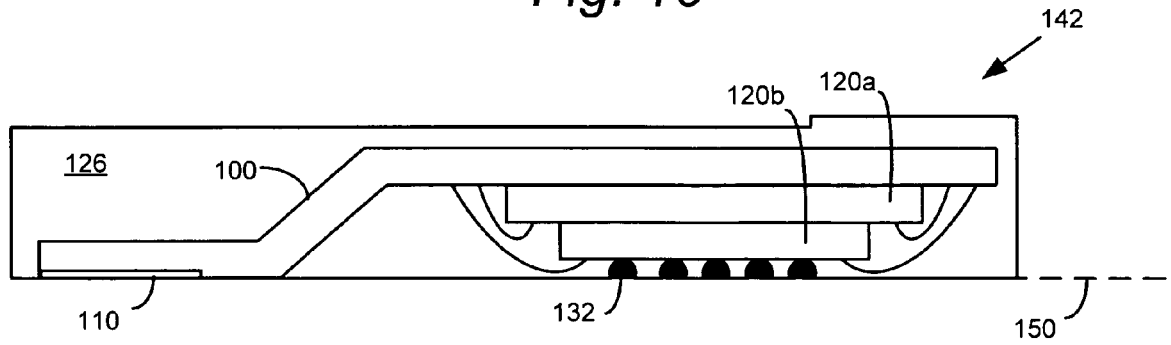
FIG. 10 is a cross-sectional view through a plane along line 10-10 in FIG. 8.

Once the solder bumps 132 have been attached to panel 90, each of the integrated circuits may be encapsulated with a molding compound 126 as shown in FIGS. 8 through 10. FIGS. 8 through 10 show individual encapsulated semiconductor packages 142 after singulation from the panel 90 as explained below. Molding compound 126 may be an epoxy such as for example available from Sumitomo Corp. and Nitto Denko Corp., both having headquarters in Japan. Other molding compounds from other manufacturers are contemplated. The molding compound may be applied according to various processes, including by transfer molding, injection molding and, in embodiments, flood molding to form an encapsulation on panel 90 encompassing all of the integrated circuits.

In such processes, a panel 90 may be put into a mold having an upper and lower die, or mold caps. In certain embodiments, portions of the leadframe may be left free of molding compound. Such a molding compound pattern may be achieved by forming a mirror pattern in the upper mold cap. That is, the upper mold cap is formed with a pattern having areas that contact the panel 90 at portions to be left free of molding compound during the encapsulation process. It is understood that the entire panel 90 may be encapsulated in molding compound in alternative embodiments.

The package is encapsulated so that a bottom surface of the package lies generally in the plane 150. In embodiments, the molding machine carrying out the encapsulation process may output an injection force of about 0.8 tons to drive the molding compound into the mold cavity. Due to this pressure, the portions of solder bumps 132 extending past plane 150 get substantially flattened out to the plane 150 and the bottom surface of the semiconductor package. Thus, the partially flattened solder bumps 132 are flush with and exposed to the exterior of the package, as shown in the bottom view of FIG. 9 and the cross sectional side view of FIG. 10. These exposed portions of solder bumps 132 form the test pads by which the finished package may be tested.

The solder bumps 132 are preferably made flush with the surface of the semiconductor package 142 during the encapsulation process as described above. However instead of or in addition to flattening the solder bumps during the encapsulation process, one or more additional processes may be performed to define surfaces in the solder bumps, or other electrically conductive, deformable mass, that are flush with the surface of the semiconductor package 142. Such additional processes may be performed before and/or after the encapsulation process. Such additional processes may include the application of heat, pressure or a shear force to the solder bumps 132 define a surface in the solder bumps that is or will be flush with the surface of the semiconductor package 142.

Although not critical to the invention, after the molding step, a marking can be applied to the molding compound 126. The marking may for example be a logo or other information printed on the surface of the molding compound for each integrated circuit. The marking may for example indicate manufacturer and/or type of device. The step of marking is not critical to the invention and may be omitted in alternative embodiments.

After encapsulation and marking, each of the encapsulated integrated circuits in panel 90 may then be singulated, by cutting the integrated circuits in panel 90 into a plurality of individual integrated circuit packages 142. Known cutting devices include, for example, water jet cutting, laser cutting, water guided laser cutting, dry media cutting, and diamond coated wire. Water jet cutting may be the preferred cutting device given its small cutting width and its rapid cutting rate. Water can also be used together with laser cutting to help complement or focus its effects. A further description of the cutting of integrated circuits from a panel and the shapes which may be achieved thereby is disclosed in published U.S. Application No. 2004/0259291, entitled, "Method For Efficiently Producing Removable Peripheral Cards," which application is assigned to the owner of the present invention and which application has been incorporated by reference herein in its entirety. It is understood that the singulated integrated circuits may be formed by other processes than that described above in alternative embodiments.

In the embodiments shown, the package 142 may for example be used in a Transflash flash memory device or Micro SD card. However, it is understood that the package 142 may be cut into a variety of shapes and sizes, including rectangular, in further embodiments.

In an embodiment, twenty-one test pads are provided. It is understood that the package 142 may alternatively include twenty-seven solder bumps 132 forming the test pads, and may alternatively include more or less than twenty-one or twenty-seven, for example one or more test pads. Moreover, while the solder bumps 132 are disclosed above as being mounted directly onto bond pads 124 on the controller chip 120*b*, it is understood that the solder bumps 132 forming the test pads in the finished package may be provided on the memory chip 120*a*, or on the leadframe 100, and connected to the appropriate bond pad with the use of conductive traces and/or bond wires.

Once the package is fabricated and tested via the test pads, the package may be encased in a pair of mating lids which cover the test pads, and prevent their access while the semiconductor package is in use. The package may operate without lids in further embodiments. In such embodiments, the test pads may be covered using for example a masking label, epoxy or ink. It is also conceivable that the test pads be left uncovered.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A method of forming a semiconductor package including a semiconductor die having a test pad for testing electrical operation of the semiconductor package, comprising the steps of:
   (a) coupling a mass of solder to a bond pad on the semiconductor die;
   (b) encapsulating the semiconductor die in a molding compound; and
   (c) deforming at least a portion of the mass of solder to shape the mass of solder on the bond pad as the test pad for testing electrical operation of the semiconductor package.

2. A method of forming a semiconductor package as recited in claim 1, wherein said step (c) of deforming at least a portion of the mass of solder is performed during said step (b) of encapsulating the semiconductor die.

3. A method of forming a semiconductor package as recited in claim 1, wherein said step (c) of deforming at least a portion of the mass of solder is performed before said step (b) of encapsulating the semiconductor die.

4. A method of forming a semiconductor package as recited in claim 1, wherein said step (c) of deforming at least a portion of the mass of solder is performed after said step (b) of encapsulating the semiconductor die.

5. A method of forming a semiconductor package as recited in claim 1, wherein the mass of solder is a solder bump.

6. A method of forming a semiconductor package as recited in claim 1, said step (a) of coupling a mass of solder to a bond pad being performed by at least one of the following processes: evaporation, electroplating, printing, jetting, stud bumping, and direct placement.

7. A method of forming a semiconductor package as recited in claim 1, wherein the mass of solder is a solder ball applied to the bond pad by the application of at least one of heat and pressure.

8. A method of forming a semiconductor package as recited in claim 1, further comprising the step of preconditioning the mass of solder in an under bump metallurgy step to eliminate non-conductive aluminum oxide.

9. A method of forming a semiconductor package, including a semiconductor die having a test pad for testing electrical operation of the semiconductor package, comprising the steps of:
   (a) coupling an electrically conductive, deformable material to a bond pad on the semiconductor die;
   (b) encapsulating the semiconductor die in a molding compound, said step (b) of encapsulation resulting in a surface of the semiconductor package being defined; and
   (c) deforming at least a portion of the electrically conductive, deformable material to define a surface of the material that is substantially flush with the surface of the semiconductor package defined in said step (b), the flush surface of the electrically conductive, deformable material capable of use as the test pad for testing electrical operation of the semiconductor package.

10. A method as recited in claim 9, said step (c) of deforming at least a portion of the electrically conductive, deformable material be performed during said step (b) of encapsulating the semiconductor die.

11. A method as recited in claim 9, said step (c) of deforming at least a portion of the electrically conductive, deformable material be performed before said step (b) of encapsulating the semiconductor die.

12. A method as recited in claim 9, said step (c) of deforming at least a portion of the electrically conductive, deformable material be performed after said step (b) of encapsulating the semiconductor die.

13. A method as recited in claim 9, wherein said electrically conductive deformable material is solder.

14. A method of forming a semiconductor package including a substrate and a semiconductor die affixed to the substrate, the semiconductor die including a test pad for testing electrical operation of the semiconductor package, a reference plane being defined generally parallel to and at least proximate to a surface of the semiconductor die, the method comprising the steps of:
   (a) coupling a solder bump to the bond pad on the semiconductor die, the solder bump being intersected by the reference plane;
   (b) encapsulating the semiconductor die in a molding compound, said step (b) of encapsulation resulting in a surface of the semiconductor package being defined generally parallel to and at least proximate to the reference plane; and
   (c) deforming at least a portion of the solder bump, during said step (b) of encapsulating the semiconductor die, to define a surface of the solder bump that is substantially flush with the reference plane, the flush surface of the solder bump being capable of use as the test pad for testing electrical operation of the semiconductor package.

15. A method as recited in claim 14, wherein said step (a) of coupling a solder bump to the bond pad is performed by at least one of the following processes: evaporation, electroplating, printing, jetting, stud bumping, and direct placement.

16. A method as recited in claim 14, wherein said step (a) of coupling a solder bump to the bond pad comprises the step of coupling a solder ball by at least of the steps of applying heat and pressure.

17. A method of forming a semiconductor package as recited in claim 1, further comprising the step of preconditioning the solder bump in an under bump metallurgy step to eliminate non-conductive aluminum oxide.

* * * * *